United States Patent [19]

Ohata

[11] Patent Number: 4,893,155
[45] Date of Patent: Jan. 9, 1990

[54] HETEROJUNCTION FIELD EFFECT TRANSISTOR DEVICE AND PROCESS OF FABRICATION THEREOF

[75] Inventor: Keiichi Ohata, Tokyo, Japan

[73] Assignee: NEC Corporation

[21] Appl. No.: 194,370

[22] Filed: May 16, 1988

[30] Foreign Application Priority Data

May 14, 1987 [JP] Japan ................................. 62-11590

[51] Int. Cl.$^4$ .................... H01L 29/80; H01L 29/225
[52] U.S. Cl. ........................................ 357/22; 357/16; 357/55
[58] Field of Search ............................ 357/22, 16, 55

[56] References Cited

U.S. PATENT DOCUMENTS 4,593,301 6/1986 Inata et al. ............................ 357/22

FOREIGN PATENT DOCUMENTS 61-187373 8/1986 Japan ..................................... 357/22

Primary Examiner—Andrew J. James
Assistant Examiner—Jerome Jackson, Jr.
Attorney, Agent, or Firm—Suehrue, Mion, Zinn, MacPeak and Seas

[57] ABSTRACT

For improvement in a transit time of electrons, there is disclosed a heterojunction field effect transistor fabricated on a semi-insulating GaAs substrate, comprising a first layer overlying the semi-insulating substrate and formed of a high-purity GaAs, a second layer overlying the first layer and formed of an n-type AlGaAs which is smaller in electron affinity than the high-purity GaAs, a source region penetrating from the first layer into the second layer so as to be in contact with the active channel layer formed in the first layer and formed of an gallium-rich AlGaAs, a drain region, and a gate electrode formed on the second layer, an energy gap takes place between the source region and the first layer due to a lower edge of the conduction band thereof higher in energy level than that of the high-purity GaAs, thereby accelerating electrons supplied from the source region to the active channel layer.

5 Claims, 4 Drawing Sheets

PRIOR-ART

HETEROJUNCTION FIELD EFFECT TRANSISTOR DEVICE AND PROCESS OF FABRICATION THEREOF

FIELD OF THE INVENTION

This invention relates to a heterojunction field effect transistor and, more particularly, to a junction formed between a source region and an active channel layer.

BACKGROUND OF THE INVENTION

A heterojunction MES-type field effect transistor is a potential candidate for high-speed applications because electrons traveling along an active channel layer suffer less ionized-impurity scattering. A typical example of the heterojunction MES-type field effect transistor is illustrated in FIG. 1 of the drawings. The heterojunction field effect transistor illustrated in FIG. 1 is fabricated on a semi-insulating gallium-arsenide substrate 1. On the semi-insulating gallium-arsenide substrate 1 is grown an undoped gallium-arsenide layer 2 which is overlain by an n-type aluminum-gallium-arsenide layer 3, then a heterojunction takes place between the undoped gallium-arsenide layer 2 and the n-type aluminum-gallium-arsenide layer 3 due to difference in band-gap therebetween. Donor impurity atoms are doped into the n-type aluminum-gallium-arsenide layer 3 and the undoped gallium-arsenide layer 2 to form source and drain regions 4 and 5 on which source and drain electrodes 6 and 7 of a gold-germanium-nickel alloy are formed to provide ohmic contacts therebetween. Over that area between the source and drain regions 4 and 5 formed in the n-type aluminum-gallium-arsenide layer 3 is provided a gate electrode 8 of aluminum which is biased to control an active channel layer formed in the undoped gallium-arsenide layer 2 underneath the heterojunction between the undoped gallium-arsenide layer 2 and the n-type aluminum-gallium-arsenide layer 3. In the active channel layer, electrons are moved from the source region 4 to the drain region 5 due to difference in voltage level between the source and drain regions 4 and 5, so that a switching speed of the heterojunction field effect transistor depends upon the transit time of the electrons traveling under the gate electrode 8. For this reason, attempts are made for reduction in gate length of the heterojunction field effect transistor so as to improve the switching speed of the transistor. The word "length" is hereinunder measured in the direction between the source and drain regions of a field effect transistor.

However, a problem is encountered in saturation of the transit time when the gate is decreased in length over a certain value. This is because of the fact that the electrons are insufficiently accelerated during the traveling over the extremely short channel.

Another example is disclosed by Mimura in U.S. Pat. No. 4,424,525 and the structure disclosed therein is similar to that illustrated in FIG. 1, so that the heterojunction device disclosed in the above U.S.P. will have the problem described hereinbefore if the gate is reduced in length over the certain value.

SUMMARY OF THE INVENTION

It is therefore an important object of the present invention to provide a heterojunction field effect transistor which has an extremely high switching speed.

It is also an important object of the present invention to provide a heterojunction field effect transistor the structure of which can sufficiently accelerate carriers traveling over the active channel layer if the gate is reduced in length over the certain value.

It is still another important object of the present invention to provide a process of fabricating the heterojunction field effect transistor which is free from the problem inherent in the prior-art heterojunction field effect transistor.

To accomplish these objects, the present invention proposes to provide a source region forming a potential gap capable of accelerating carriers injected to an active channel layer.

In accordance with one aspect of the present invention, there is provided a heterojunction field effect transistor fabricated on a semi-insulating substrate, comprising: (a) a first layer overlying the semi-insulating substrate and formed of a first high-purity compound semiconductor material; (b) a second layer overlying the first layer and formed of a second compound semiconductor material which is smaller in electron affinity than the first high-purity compound semiconductor material, an active channel layer taking place in a portion of the first layer along a heterojunction formed between the first layer and the second layer; (c) a source region penetrating from the first layer into the second layer so as to be in contact with the active channel layer, the source region being formed of a third compound semiconductor material; (d) a drain region penetrating from the first layer into the second layer so as to be in contact with the active channel layer, the drain region being spaced from the source region; and (e) a gate electrode formed on the second layer, the gate electrode being biased to control the active channel layer, wherein the third compound semiconductor material has a lower edge of a conduction band higher in energy level than that of the first high-purity compound semiconductor material but lower in energy level than that of the second compound semiconductor material.

The second layer and the source region may be formed of an n-type aluminum gallium arsenide represented by $Al_{x1}Ga_{1-x1}As$ and a heavily-doped n-type aluminum gallium arsenide represented by $Al_{x2}Ga_{1-x2}As$, wherein x1 is larger in value than x2.

In accordance with another aspect of the present invention there is provided a process of fabricating a heterojunction field effect transistor, comprising the steps of: (a) preparing a semi-insulating substrate having a major surface; (b) removing a portion of the semi-insulating substrate to form a side wall substantially perpendicular to the major surface; (c) growing a first layer of a first compound semiconductor material on the semi-insulating substrate; (d) growing a second layer of a second compound semiconductor material on the first layer, the second compound semiconductor material containing at least first and second elements the former of which is obliquely supplied to the second layer with respect to the major surface and the latter of which is perpendicularly supplied to the second layer with respect to the major surface; (e) growing a third layer of a third compound semiconductor material on the second layer; (f) removing a part of the third layer to expose a part of the second layer; (g) forming electrodes one of which is formed on the part of the second layer and the others of which are provided on the third layer.

The second semiconductor material may be formed of aluminum-gallium-arsenides different in aluminum atom concentration from one another and simultaneously grown by using a molecular beam epitaxy technique. In this implementation, the first and second elements may be formed by gallium atoms and aluminum atoms, respectively.

BRIEF DESCRIPTION OF THE DRAWINGS

The features and advantages of a heterojunction field effect transistor according to the present invention will be more clearly understood from the following description taken in conjunction with the accompanying drawings in which.

DESCRIPTION OF THE PREFERRED EMBODIMENT

Figure 1:
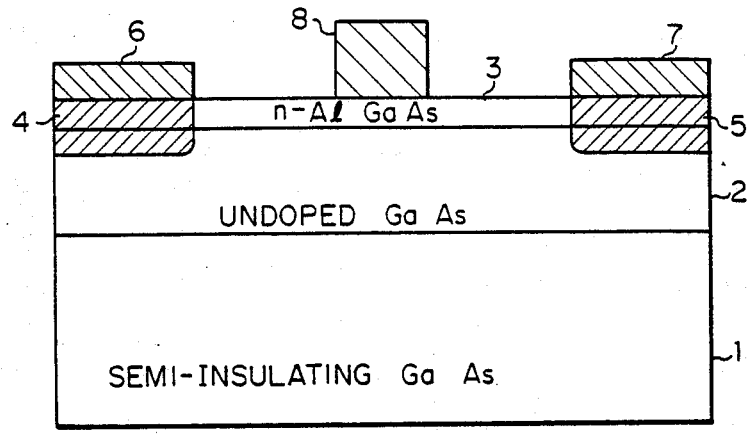
FIG. 1 is a cross sectional view showing the structure of a prior-art heterojunction field effect transistor.
Figure 2:
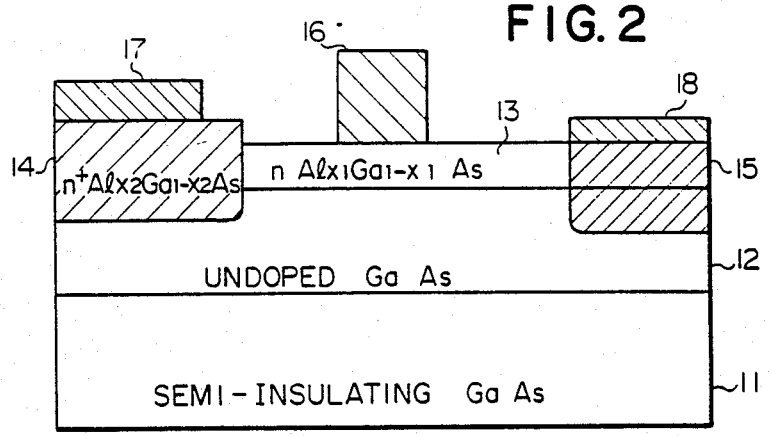
FIG. 2 is a cross sectional view showing the structure of a heterojunction field effect transistor embodying the present invention.
Figure 3:
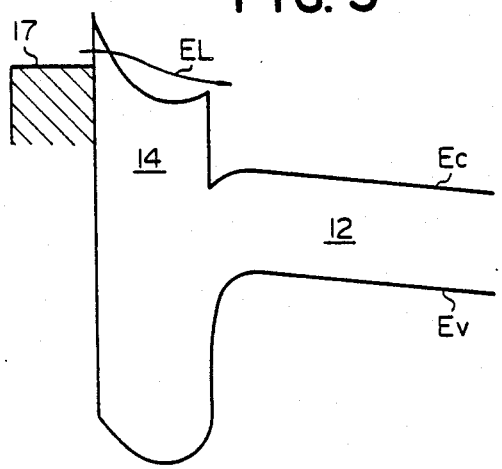
FIG. 3 is a diagram showing the energy band of the heterojunction field effect transistor illustrated in FIG. 2 in an active biasing mode.

Referring to FIG. 2 of the drawings, there is shown the structure of a heterojunction MES-type field effect transistor embodying the present invention. The heterojunction field effect transistor illustrated in FIG. 2 is fabricated on a semi-insulating gallium-arsenide substrate 11 overlain by an undoped gallium-arsenide layer 12. On the undoped gallium-arsenide layer 12 is formed an n-type aluminum-gallium-arsenide layer 13 of $Al_{x1}Ga_{1-x1}As$ where x1 ranges from about 0.1 to about 0.5. The undoped gallium-arsenide is larger in electron affinity than the n-type aluminum-gallium-arsenide so that a first potential barrier takes place at a first heterojunction therebetween. A source region 14 is formed in the n-type aluminum-gallium-arsenide layer 13 and partially penetrates into the undoped gallium-arsenide layer 12. The source region 14 is formed of a heavily-doped n-type aluminum-gallium-arsenide of $Al_{x2}Ga_{1-x2}As$ where x2 ranges between about 0.02 and about 0.40, and a drain region 15 is formed by heavy doping of n-type impurity atoms of, for example, silicon extending into the undoped gallium-arsenide layer 12. On the n-type aluminum-gallium-arsenide layer 13 between the source region 14 and the drain region 15 is provided a gate electrode 16 of, for example, aluminum which is biased to a certain voltage level to control an active channel layer in the undoped gallium-arsenide layer 12 underneath the heterojunction, and x1 is larger in value than x2 so that a second potential barrier takes place between the source region 14 and the active channel layer. However, the second potential barrier is smaller in height than the first potential barrier due to difference in electron affinity between the n-type aluminum-gallium-arsenide $Al_{x1}Ga_{1-x1}As$ and the heavily-doped n-type aluminum-gallium-arsenide $Al_{x2}Ga_{1-x2}As$, so that electrons supplied from the source region 14 are injected into the active channel layer but do not enter into the aluminum-gallium-arsenide layer 13. Moreover, the electrons EL are rapidly accelerated upon stepping down the second potential barrier between the source region 14 and the undoped gallium-arsenide layer as illustrated in FIG. 3, so that the transit time of the electrons are shortened regardless of the gate length. This results in improvement in switching speed of the heterojunction field effect transistor with the structure according to the present invention. In this instance, the gate electrode 16 has a length of about 0.5 micron, however the structure illustrated in FIG. 2 is useful if the gate electrode is smaller in length than 1.0 micron.

The heterojunction MES-type field effect transistor illustrated in FIG. 2 further comprises source and drain electrodes 17 and 18 provided on the source and drain regions 14 and 15, respectively, and each of the source and drain electrodes 17 and 18 is formed of, for example, aurum-germanium-nickel alloy and forms an ohmic contact between the electrode 17 or 18 and the source or drain region 14 or 15. The heterojunction MES-type field effect transistor thus arranged has an energy band illustrated in FIG. 3 in which Ec and Ev represent the lower edge of the conduction band and the upper edge of the valence band, respectively.

The structure of the heterojunction MES-type field effect transistor illustrated in FIG. 2 is fabricated by a process described hereinunder. In the process sequence, an undoped gallium-arsenide layer and an n-type aluminum-gallium-arsenide layer $Al_{x1}Ga_{1-x1}As$ are successively grown on a semi-insulating gallium-arsenide substrate, and the undoped gallium-arsenide layer and the n-type aluminum-gallium-arsenide layer $Al_{x1}Ga_{1-x1}As$ are partially removed to form a cavity which is filled with a heavily-doped n-type aluminum-gallium-arsenide $Al_{x2}Ga_{1-x2}As$ to form a source region. After formation of the source region, silicon atoms are selectively doped into the n-type aluminum-gallium-arsenide layer $Al_{x1}Ga_{1-x1}As$ and partially into the undoped gallium-arsenide layer to form a drain region, and a gate electrode and source and drain electrodes are respectively formed on the upper surface of the structure.

Figure 4A:
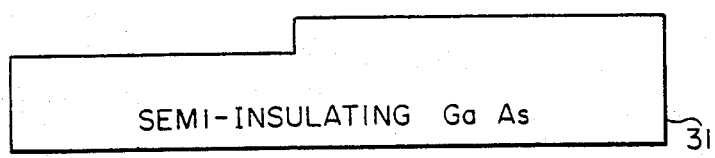
FIGS. 4A to 4E are cross sectional views showing a series of process steps for fabrication of a heterojunction field effect transistor according to the present invention.
Figure 4B:
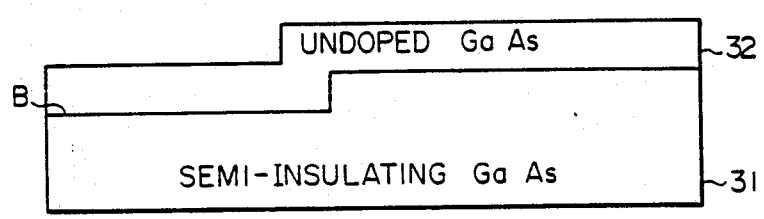
Figure 4C:
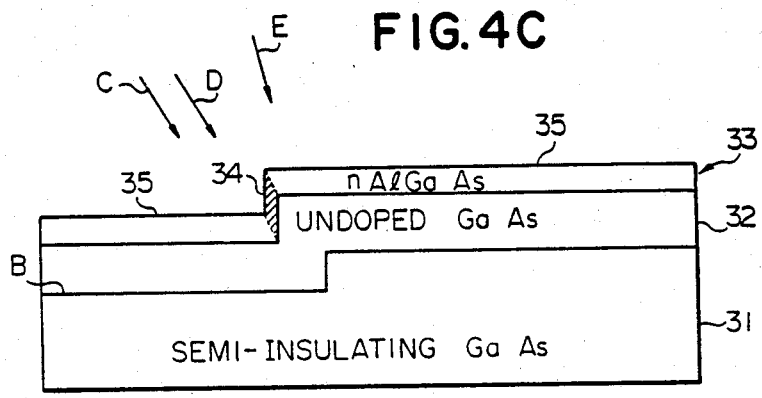

Another process sequence is described hereinunder with reference to FIGS. 4A to 4E. The process starts with a semi-insulating gallium-arsenide substrate 31 which is partially removed to form a step configuration as illustrated in FIG. 4A. On the entire surface of the semi-insulating gallium-arsenide substrate 31, an undoped gallium-arsenide layer 32 is grown by using a molecular-beam epitaxy which is carried out with a flux of gallium atoms in an arsenic ambient. The flux of gallium atoms is obliquely radiated from a source with respect to the upper surface B of the structure as indicated by an arrow A in FIG. 4B, so that the undoped gallium-arsenide layer uniformly covers the step configuration.

Subsequently, a heavily-doped n-type aluminum-gallium-arsenide layer 33 is grown on the undoped gallium-arsenide layer 32 by using a molecular-beam-epitaxy. In the molecular-beam-epitaxy for formation of the aluminum-gallium-arsenide layer 33, a flux of gallium atoms and a flux of silicon atoms are obliquely radiated from respective sources with respect to the upper surface B of the structure as indicated by arrows C and D, respectively, in FIG. 4C, however a flux of aluminum atoms is radiated from a source in a direction closer to a perpendicular direction with respect to the surface B as indicated by an arrow E, so that a side portion 34 of the aluminum-gallium-arsenide layer 33 covering the perpendicular surface of the step configuration contains aluminum atoms smaller in concentration than a remaining portion 35 of the aluminum-gallium-arsenide layer 33, but the side portion 34 is greater in silicon atom than the remaining portion 35. Thus, the aluminum-gallium-arsenide layer 33 has the two portions different in composition from each other, however the two portions 34 and 35 are simultaneously grown on the undoped gallium-arsenide layer 32, so that the two portions 34 and 35 has an improved boundary surface therebetween in comparison with the structure fabricated by the process described hereinbefore.

Figure 4D:
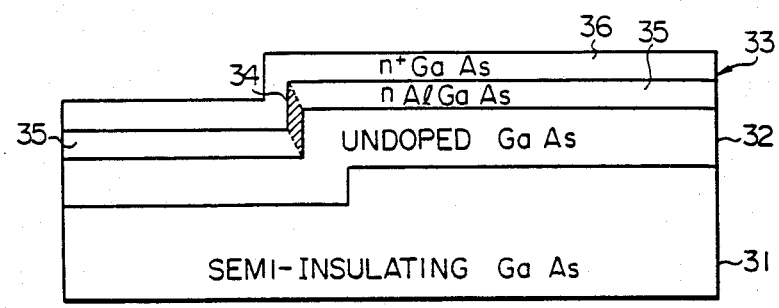
Figure 4E:
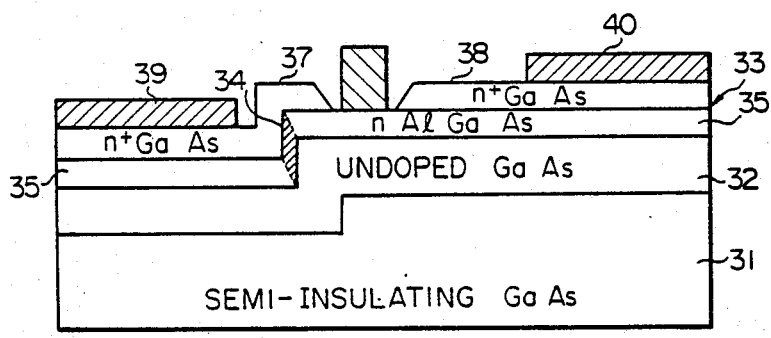

When the aluminum-gallium-arsenide layer 33 is grown to a certain thickness, the aluminum flux indicated by the arrow E is blocked by a shutter plate (not shown), then a heavily-doped gallium-arsenide layer 36 is grown on the aluminum-gallium-arsenide layer 33 as illustrated in FIG. 4D. The heavily-doped gallium-arsenide layer 36 is partially removed to expose a part of the remaining portion 35 by using an appropriate etching technique, so that contact regions 37 and 38 are formed in spacing relationship therebetween. On the exposed part of the remaining portion 35 is formed a gate electrode of, for example, aluminum which is in contact with the remaining portion 35 of the aluminum-gallium-arsenide layer 33. Source and drain electrodes 39 and 40 are formed on the contact regions 37 and 38, respectively, so that the source electrode 39 are electrically connected to the side portion 34 of the heavily-doped n-type aluminum-gallium-arsenide through the contact region 37.

In another implementation, a gallium-indium-arsenide is used for a semi-insulating substrate, and an aluminum-indium-arsenide layer is grown on the semi-insulating substrate. In this implementation, a source region is formed of a gallium-arsenide or a gallium-rich gallium-indium-arsenide but a drain region is formed in an usual manner to form an ohmic contact.

In still another implementation, a gallium-arsenide is used as a semi-insulating substrate, and a gallium-indium-phosphide layer is grown on the semi-insulating substrate. A source region is formed of gallium-indium-phosphide containing a relatively small amount of gallium atoms, and a drain region is formed of an usual material to form an ohmic contact.

Although particular embodiment of the present invention have been shown and described, it will be obvious to those skilled in the art that various changes and modifications may be made without departing from the spirit and scope of the present invention.

What is claimed is:

1. A heterojunction field effect transistor fabricated on a semi-insulating substrate, comprising:
   (a) a first layer overlying said semi-insulating substrate and formed of a first high-purity compound semiconductor material, said first layer having a lower portion, an upper portion and a first shoulder portion interconnecting the lower and upper portions;
   (b) a second layer topographically overlying said first layer so that a step configuration of said first shoulder portion is transferred to said second layer to form lower and upper portions formed of a second compound semiconductor material and a second shoulder portion interconnecting the lower and upper portions and formed of a fourth compound semiconductor material, said second compound semiconductor material being smaller in electron affinity than said first high-purity compound semiconductor material, said fourth compound semiconductor material being smaller in electron affinity than said first high-purity compound semiconductor material but larger in electron affinity than said second compound semiconductor material, an active channel layer taking place in said upper portion of said first layer along a heterojunction formed between said first layer and said second layer;
   (c) a source contact region formed on the lower portion of said second layer so as to be in contact with said second shoulder portion, said source contact region being formed of a third compound semiconductor material;
   (d) a drain region formed on the upper portion of said second layer so as to be electrically coupled to said active channel layer, said drain region being spaced from said source region; and
   (e) a gate electrode formed on the upper portion of said second layer, said gate electrode being biased to control said active channel layer, wherein said fourth compound semiconductor material has a lower edge of a conduction band higher in energy level than that of said first high-purity compound semiconductor material but lower in energy level than that of said second compound semiconductor material.

2. A heterojunction field effect transistor as set forth in claim 1, in which said first layer is formed of undoped gallium-arsenide.

3. A heterojunction field effect transistor as set forth in claim 2, in which said second compound semiconductor material is formed of n-type aluminum-gallium-arsenide represented by $Al_{x1}Ga_{1-x1}As$ where x1 ranges between about 0.1 and about 0.5, and in which said fourth compound semiconductor material is formed of n-type aluminum-gallium-arsenide having an aluminum content less than that of said second compound semiconductor material.

4. A heterojunction field effect transistor as set forth in claim 3, in which said fourth region is formed of heavily-doped n-type aluminum-gallium-arsenide represented by $Al_{x2}Ga_{1-x2}As$ where x2 ranges between about 0.02 and about 0.40.

5. A heterojunction field effect transistor as set forth in claim 4, in which said gate electrode is smaller in length than about 1.0 micron.

* * * * *

UNITED STATES PATENT AND TRADEMARK OFFICE
CERTIFICATE OF CORRECTION

PATENT NO. : 4,893,155

DATED : January 9, 1990

INVENTOR(S) : Keiichi Ohata

It is certified that error appears in the above-identified patent and that said Letters Patent is hereby corrected as shown below:

On the title page:

[30] Foreign Application Priority Data, delete "62-11590", and insert --62-115904--.

Signed and Sealed this

Twenty-sixth Day of February, 1991

Attest:

HARRY F. MANBECK, JR.

*Attesting Officer*            *Commissioner of Patents and Trademarks*